United States Patent [19]
Matsuda et al.

[11] 4,412,234
[45] Oct. 25, 1983

[54] LIGHT EMITTING DIODE

[75] Inventors: Motonobu Matsuda, Kawachinagano; Yoshihiro Tanaka, Osaka, both of Japan

[73] Assignee: Minolta Camera Kabushiki Kaisha, Osaka, Japan

[21] Appl. No.: 244,321

[22] Filed: Mar. 16, 1981

[30] Foreign Application Priority Data

Apr. 1, 1980 [JP] Japan ................................ 55-43351
Jan. 22, 1981 [JP] Japan ................................ 56-8706

[51] Int. Cl.³ .................... H01L 33/00; H01L 23/48; H01L 23/28; H01L 25/04
[52] U.S. Cl. ..................................... 357/17; 357/68; 357/72; 357/84
[58] Field of Search ............... 357/17, 72, 68, 55, 357/84, 76; 362/800

[56] References Cited
U.S. PATENT DOCUMENTS

| 2,984,775 | 5/1961 | Matlow et al. | 357/68 X |
| 3,855,606 | 12/1974 | Schoberl | 357/17 |
| 3,974,514 | 8/1976 | Kressel et al. | 357/17 |
| 3,991,339 | 11/1976 | Lockwood et al. | 357/17 X |
| 4,047,075 | 9/1977 | Schoberl | 357/72 X |
| 4,236,296 | 12/1980 | Woolhouse et al. | 357/55 X |
| 4,288,757 | 9/1981 | Kajimura et al. | 357/17 X |

Primary Examiner—Martin H. Edlow
Assistant Examiner—J. L. Badgett
Attorney, Agent, or Firm—Wenderoth, Lind & Ponack

[57] ABSTRACT

A light emitting diode constituted by a pair of semiconductor layers having a planar P-N junction therebetween, the semiconductor layers having at least one side surface extending transversely across the P-N junction and from which light is emitted in a direction parallel with the plane of the P-N junction, a pair of electrodes on the respective outer surfaces of the pair of semiconductor layers parallel with the plane of the P-N junction plane, at least one of the pair of electrodes covering an area less than the total area of the P-N junction and being located adjacent to the one side surface from which the light is emitted, the remainder of the area of the outer surface of the semiconductor layer not being covered by the electrode, and a light shielding member covering the remainder of the area of the outer surface of the semiconductor layer which is not covered by the one electrode. The light shield member is made of a material identical with that of the one electrode, and is insulated from the one electrode, and the light shielding member and the one electrode are spaced from each other to define a gap therebetween for insulating them from each other.

4 Claims, 7 Drawing Figures

LIGHT EMITTING DIODE

BACKGROUND OF THE INVENTION AND PRIOR ART

The present invention relates to a light emitting diode utilizable as a light source for a triangulation type distance measuring device such as is used in an automatic focus control camera.

A light emitting diode is known which includes a pair of semiconductor layers with a planar P-N junction therebetween, and which is provided with at least one surface formed by cutting the semiconductor layers across the P-N junction, the edge of the junction emitting light in a direction parallel with the P-N junction, such as is disclosed in Japanese Patent Application Laid Open No. 54-40662 and in copending U.S. patent application Ser. No. 940,135, filed Sept. 6, 1978, and assigned to the same assignee as the present application.

FIG. 1 is a schematic illustration of such a prior art light emitting diode. As shown in FIG. 1, the light emitting diode comprises a P-type semiconductor layer $P_1$ and an N-type semiconductor layer $N_1$ with a planar P-N junction 2 formed therebetween. The entire upper surface of the P-type semiconductor layer $P_1$ is coated with AuZn deposited by an evaporation deposition technique to form an electrode $A_1$ to which a wire $W_1$ is bonded to supply power to the diode. The N-type semiconductor layer $N_1$ has firmly mounted on the lower surface thereof an electrically conductive substrate (not shown), which serves as the counter electrode to the electrode $A_1$.

Four side surfaces such as 4 and 6 are formed by cutting the semiconductor layers $P_1$ and $N_1$ across the P-N junction so that light beams a, b, c and d are emitted from the edges of the junction in a direction parallel with the plane of the junction 2. Any one of the light beams a, b, c and d can be utilized as a source of light to be projected toward an object in a triangulation type distance measuring device.

However, the above-described ordinary light emitting diode has an undesirable characteristic that the light emitting efficiency decreases when the current supply is increased for the purpose of increasing the absolute intensity of the emitted light due to an increase in the temperature of the P-N junction. In other words, a greater part of the increase in the current supplied does not effect a desirable increase in intensity, but rather is consumed by the increased temperature of the P-N junction.

OBJECT AND BRIEF DESCRIPTION OF THE INVENTION

An object of the present invention is to provide a light emitting diode with an improved light emitting efficiency.

To this end, the present invention provides a light emitting diode which comprises a pair of semiconductor layers having a planar P-N junction therebetween, said semiconductor layers having at least one side surface extending transversely across said P-N junction and from which a light is emitted in a direction parallel with the plane of said P-N junction; and a pair of electrodes on the respective outer surfaces of said pair of semiconductor layers parallel to the plane of said P-N junction plane, at least one of said pair of electrodes covering an area less than the total area of said P-N junction and being located adjacent to said one side surface from which the light is emitted, the remainder of the area of the outer surface of said semiconductor layer not being covered by said electrode.

BRIEF DESCRIPTION OF THE DRAWINGS

The invention will now be described in greater detail in connection with the accompanying drawings, in which.

DETAILED DESCRIPTION OF THE PREFERRED EMBODIMENTS

Figure 2:
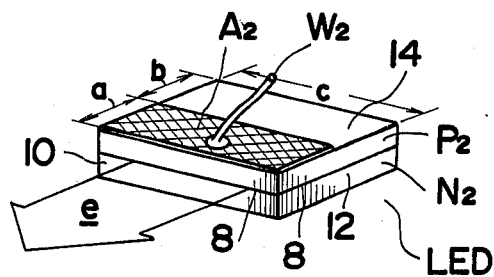
FIG. 2 is a perspective view of an embodiment of a light emitting diode according to the present invention.

A first embodiment of the light emitting diode LED according to the invention and shown in FIG. 2 comprises a P-type semiconductor layer $P_2$ and an N-type semiconductor layer $N_2$ with a planar P-N junction 8 formed therebetween. The semiconductor layers $P_2$ and $N_2$ have four side surfaces, only two of which, i.e. surfaces 10 and 12, are shown, which are formed by cutting the semiconductor layers $P_2$ and $N_2$ transversely across the plane of the P-N junction 8. The side surfaces are here shown as substantially perpendicular to the plane of the P-N junction. Light beam e emitted from the edge of P-N junction 8 and appearing on surface 10 can be utilized as a source of light to be projected toward an object, the distance of which is to be measured by a triangulation type distance measuring device. An electrode $A_2$ is formed on the portion of the upper surface of the P-type semiconductor layer adjacent to the surface 10 from which the light beam e is emitted. The total area of the electrode $A_2$ is less than the total area of the planar P-N junction 8 so that the area 14 on the upper surface of the P-type semiconductor layer $P_2$ is left uncovered by the electrode $A_2$. A lead wire $W_2$ is bonded on the electrode $A_2$.

An example of a practical size of the diode is as follows:

$$a = b = 0.2 \text{ mm, and } c = 0.5 \text{ mm.}$$

In other words, the area of the electrode $A_2$ is approximately equal to the area of the portion 14 not covered by the electrode. The overall dimensions of the diode shown in FIG. 2 are identical with those of the prior art diode shown in FIG. 1. However, the dimensions of the light emitting diode and the electrode $A_2$ or its shape are not necessarily limited to the above values or shape, but can be widely modified.

Figure 3:
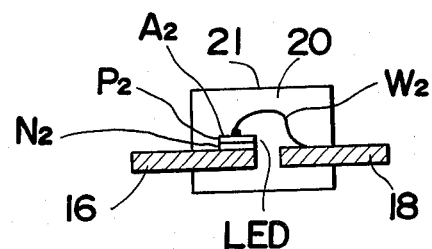
FIG. 3 is a cross-sectional view of a practical use of the embodiment.

The embodiment shown in FIG. 2 can be used as a light source unit in the manner illustrated in FIG. 3. In FIG. 3, an electrically conductive substrate 16 has the lowest surface of the N-type semiconductor layer $N_2$ of the diode firmly mounted thereon. An electrically conductive member 18, which is similar to the electrically conductive substrate 16 in shape and material is positioned so as to be insulated from the electrically conductive substrate 16. The wire $W_2$ connects the electrically conductive member 18 and the electrode $A_2$. All the above elements are contained within a package 20 formed by molding a transparent plastic over the diode, the wire $W_2$ and the opposed edges of the substrate 16 and the member 18 with the free end of the conductive substrate 16 and the free end of the conductive member 18 both projecting out of the package 20, as shown in FIG. 3, as a pair of terminals for external connection to the diode. The direction of the light beam e as shown in FIG. 2 is perpendicular to the plane of FIG. 3.

Figure 1:
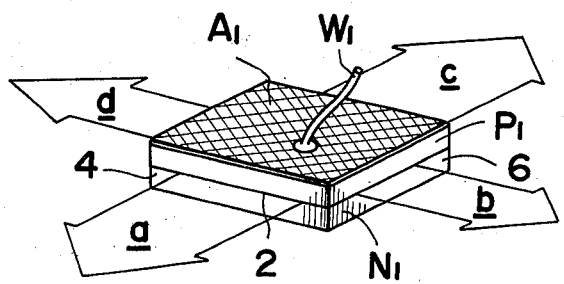
FIG. 1 is a perspective view of a prior art light emitting diode.

In the operation of the diode according to the abovedescribed embodiment shown in FIGS. 2 and 3, a current which is fed from the conductive member 18 through wire $W_2$, mainly flows through the area of the planar P-N junction 8 corresponding to the area of the electrode $A_2$ adjacent to the side surface 10 from which the light beam e is emitted. The part of the semiconductor layers which are not covered by the electrode $A_2$ serve as a heat absorber since the current flow through the area of the P-N junction 8 corresponding to the area 14 not covered by the electrode $A_2$ is considerably less, resulting in a smaller increase in the temperature. In other words, the portion of the planar P-N junction 8 corresponding to the area of the electrode $A_2$ is cooled by the absorption of heat by the lower temperature part of the semiconductor layers corresponding to the area 14 not covered by the electrode $A_2$. In this manner, the area of the P-N junction adjacent the side surface 10 from which the light beam e is emitted is supplied with the electric current yet the increase of the temperature is limited so that it effectively emits light. Further, the intensity of the light beams emitted in other directions, such as directions corresponding to beams b, c and d in FIG. 1, is reduced since the current flowing through the areas of the P-N junction adjacent to the other side surfaces, such as surface 12, is reduced in the embodiment in FIG. 2 due to the reduced area of electrode $A_2$ adjacent thereto. This means that emitted light which is not used is reduced since only a light beam extending in one direction, such as e in FIG. 2, is normally required in a light source of a triangulation type distance measuring device.

Figure 4:
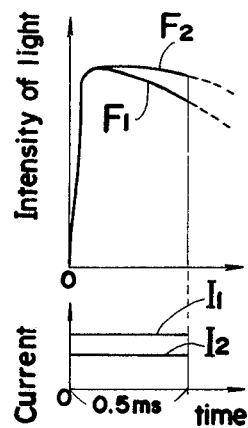
FIG. 4 is a graph of the function of the light emitting diode of the present invention.

FIG. 4 is a graph showing the change in the intensity of emitted light versus the time of application of the current for particular current supplies and comparing the embodiment shown in FIG. 1. In FIG. 4, curve $F_1$ represents the change in intensity of the light beam a in FIG. 1 with the passage of time when the current $I_1$ is supplied. Curve $F_2$ represents the change in intensity of the light beam e in FIG. 2 with the passage of time when the current $I_2$ is supplied. FIG. 4 shows that in the diode according to the present invention an initial intensity equal to the intensity obtained in an ordinary light emitting diode by a current $I_1$ can be attained by a current $I_2$ which is less than the current $I_1$, and when the current is maintained, the intensity decreases over a period of time at a smaller rate than is the case with an ordinary light emitting diode. FIG. 4 further shows that the initial intensity would be greater for a diode according to the present invention than for the ordinary light emitting diode with an identical current supplied to both the diodes. Thus, it is seen that the light emitting diode according to the present invention is much more efficient than the prior art diode.

Figure 5:
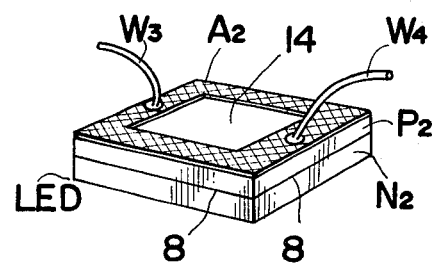
FIG. 5 is a perspective view of a second embodiment of a light emitting diode according to the present invention.

FIG. 5 shows a second embodiment of the present invention, in which like parts to those in FIG. 2 are represented by like reference numbers and characters, so that an explanation of these parts can be omitted. The diode shown in FIG. 5 is a type in which a plurality of light beams is emitted one in each of the four directions, such as a, b, c and d in FIG. 1. The electrode $A_2$ has a shape which covers only the peripheral portion of the upper surface of the P-type semiconductor layer $P_2$ and a central opening is left therein which constitutes the area 14 left uncovered by the electrode $A_2$. Thus, electrode $A_2$ has portions adjacent each of the four side surfaces formed by cutting the semiconductor layers across the planar P-N junction, respectively, and the total area of the electrode $A_2$ is less than the total area of the planar P-N junction. The electrode $A_2$ has a pair of wires $W_3$ and $W_4$ bonded thereto. In this embodiment, the part of the semiconductor layers which corresponds to the area 14 functions as a heat absorber.

Figure 6:
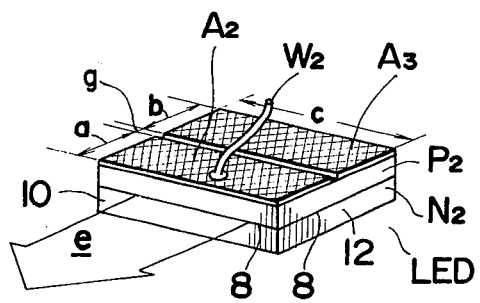
FIG. 6 is a perspective view of a third embodiment of the light emitting diode according to the present invention.
Figure 7:
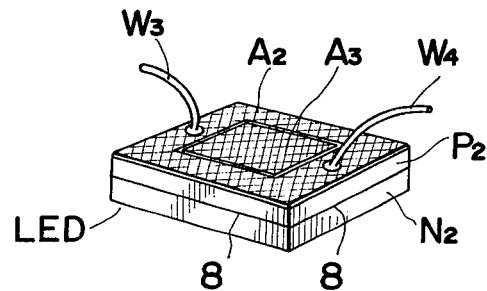
FIG. 7 is a perspective of a fourth embodiment of a light emitting diode of the present invention.

FIGS. 6 and 7 show third and fourth embodiments of the present invention, respectively, in which like parts to the parts shown in FIGS. 2 and 5 have like reference numbers and characters, so that an explanation of these parts can be omitted. In FIGS. 6 and 7, a light shielding member $A_3$ is provided for covering the area 14 of the upper surface of the P-type semiconductor layer $P_2$ which is not covered by the electrode $A_2$. The light shielding member $A_3$ can be a conductive material identical with that of electrode $A_2$, and can be coated on the semiconductor layer $P_2$ at the same time and by the same method as the electrode $A_2$ by using a suitable mask for forming a very narrow gap g between the electrode $A_2$ and light shielding member $A_3$ for insulating them from each other. Alternatively, the light shielding member $A_3$ can be formed by painting or coating the whole of the upper surface or part of the upper surface which includes at least the area 14 of the light emitting diode as in FIG. 2 or 5 with a non-conductive light shielding material.

The light shielding member $A_3$ functions in the following circumstances. In the embodiment of FIG. 2, for example, in the absence of the light shield, light generated at the planar P-N junction 8 is also emitted upwardly through the area 14 of the P-type semiconductor layer $P_2$ which is not covered by the electrode $A_2$. This light illuminates the upper surface 21 of package 20 shown in FIG. 3 and makes the upper surface 21 a secondary light source. Thus, the light source unit as shown in FIG. 3 will emit two light beams, i.e., one directly from the edge of the planar P-N junction 8 which corresponds to the light beam e in FIG. 2, and the other from the upper surface 21. Two such beams will confuse the triangulation type distance measurement. The light shielding member $A_3$ prevents this undesirable emission of light and improves the high efficiency light emitting diode of the present invention.

The light emitting diode according to the present invention can be easily manufactured simply by changing the shape of mask used in an evaporation deposition coating method for the electrode $A_2$ in FIG. 2 or 5 or the electrode $A_2$ plus the light shielding member $A_3$ in FIG. 6 or 7 from that used for the ordinary light emitting diode as in FIG. 1, and greatly improves the efficiency of emitting light for the current supplied.

What is claimed is:
1. A light emitting diode comprising:

a pair of semiconductor layers having a planar P-N junction therebetween, said semiconductor layers having at least one side surface extending transversely across said P-N junction and from which light is emitted in a direction parallel with the plane of said P-N junction;

a pair of electrodes on the respective outer surfaces of said pair of semiconductor layers parallel with the plane of said P-N junction plane, at least one of said pair of electrodes covering an area less than the total area of said P-N junction and being located adjacent to said one side surface from which the light is emitted, the remainder of the area of the outer surface of said semiconductor layer not being covered by said electrode; and a light shielding member covering said remainder of the area of the outer surface of said semiconductor layer which is not covered by said one electrode, said light shield member is made of a material identical with that of said one electrode, and being insulated from said one electrode, and said light shielding member and said one electrode being spaced from each other to define a gap therebetween for insulating them from each other.

2. A light emitting diode as claimed in claim 1, wherein the other of the pair of electrodes comprises an electrically conductive substrate on which said pair of semiconductor layers is mounted.

3. A light emitting diode as claimed in claim 2, further comprising an electrically conductive member insulated from said conductive substrate, a wire connecting said conductive member and said one electrode, and a transparent material molded around said pair of semiconductor layers, said pair of electrodes, said wire, and said conductive member, with one end of said conductive substrate and one end of said conductive member projecting out of said transparent material and constituting a pair of terminals for external connection to said diode.

4. A light emitting diode as claimed in claim 1, wherein said pair of semiconductors have a plurality of side surfaces extending transversely across said P-N junction, and said one electrode has portions adjacent each of said side surfaces.

* * * * *